United States Patent
Radosavljevic et al.

(10) Patent No.: US 7,342,277 B2
(45) Date of Patent: Mar. 11, 2008

(54) TRANSISTOR FOR NON VOLATILE MEMORY DEVICES HAVING A CARBON NANOTUBE CHANNEL AND ELECTRICALLY FLOATING QUANTUM DOTS IN ITS GATE DIELECTRIC

(75) Inventors: Marko Radosavljevic, Beaverton, CA (US); Amlan Majumdar, Portland, OR (US); Suman Datta, Beaverton, OR (US); Justin Brask, Portland, OR (US); Brian Doyle, Beaverton, CA (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/285,763

(22) Filed: Nov. 21, 2005

(65) Prior Publication Data

US 2007/0114593 A1    May 24, 2007

(51) Int. Cl.
   *H01L 29/76* (2006.01)
(52) U.S. Cl. .............. 257/314; 257/321; 257/324; 257/E29.304; 257/E29.309
(58) Field of Classification Search ............. 257/314, 257/315, 317, 321, E29.129, E29.3, E29.309, 257/324, E29.304
See application file for complete search history.

(56) References Cited

U.S. PATENT DOCUMENTS 6,998,634 B2 * 2/2006 Cheong et al. ................ 257/9
7,015,500 B2 * 3/2006 Choi et al. .................... 257/40

OTHER PUBLICATIONS

M.S. Fuhrer, et al. "High-Mobility Nanotube Transistor Memory", Nano Letters, 2002, vol. 2, No. 7, pp. 755-759, Department of Physics, University of Maryland, College Park, Maryland, May 30, 2002.
M. Radosavljevic, et al., "Nonvolatile Molecular Memory Elements Based On Ambipolar Nanotube Field Effect Transistors", Nano Letters 2002, vol 2, No. 7, pp. 761-764, Department of Physics and Astronomy Laboratory for Research on the Structure of Matter, University of Pennsylvania, Philadelphia, Pennsylvania, Jun. 1, 2002.

* cited by examiner

*Primary Examiner*—Minh-Loan Tran
(74) *Attorney, Agent, or Firm*—Blakely, Sokoloff, Taylor & Zafman LLP

(57) ABSTRACT

A transistor is described having a source electrode and a drain electrode. The transistor has at least one semiconducting carbon nanotube that is electrically coupled between the source and drain electrodes. The transistor has a gate electrode and dielectric material containing one or more quantum dots between the carbon nanotube and the gate electrode.

12 Claims, 6 Drawing Sheets

TRANSISTOR FOR NON VOLATILE MEMORY DEVICES HAVING A CARBON NANOTUBE CHANNEL AND ELECTRICALLY FLOATING QUANTUM DOTS IN ITS GATE DIELECTRIC

FIELD OF INVENTION

The field of invention relates generally to the electronic arts and, more specifically, to a transistor for non volatile memory device having a carbon nanotube and electrically floating quantum dots in its gate dielectric.

BACKGROUND

FIG. 1 shows a depiction of a prior art floating gate field effect transistor (FET). The floating gate transistor depicted in FIG. 1 includes a semiconductor substrate 101 having source 108 and drain 109 regions. Above the semiconductor substrate are: 1) a source electrode/contact 106 made of metal; 2) a drain electrode/contact 107 made of metal; and, 3) a multilayer gate structure that includes an electrically conductive "control" gate electrode 105 and an electrically conductive "floating" gate electrode 103 that is sandwiched between dielectric layers 102 and 104.

Being a field effect transistor, the amount of current that flows through the drain 107 and source 106 nodes ($I_{DS}$) of the floating gate FET in response to a voltage applied across its drain 107 and source 106 nodes ($V_{DS}$) is a function of the number of free carriers that are induced along a "channel" that resides along the surface of the semiconductor substrate 101 beneath the lower dielectric 102 of the gate structure. The number of free carriers that are induced in the channel is a function of the electrical state of the gate structure.

In particular, if the capacitor formed by the floating gate 103 and dielectric 102 layer is holding a large positive electrical charge (which corresponds to a larger positive voltage being held by the floating gate 103), more free electrons will be induced in the channel in response to an applied positive voltage at the control gate electrode 105 than if a small positive electrical charge were held by the capacitor and the same applied positive voltage were applied at the control gate electrode 105. That is, the amount of charge held by the capacitor formed by the floating gate electrode 103 and dielectric layer 102 affects the threshold or "turn-on" voltage of the device.

Because the capacitor formed by the floating gate 103 and dielectric layer 102 can hold charge for long periods of time without the application of an external electrical voltage source, floating gate transistors have been used to effect non volatile semiconductor memory storage cells. Specifically, different device thresholds effected with different charge levels held by the capacitance between the floating gate electrode 103 and the channel are used to represent whether the transistor is holding a logical 0 or a logical 1.

For instance, in the case of an n-type channel, a higher positive voltage applied to the control gate electrode 105 results in more positive charge being held by the floating gate electrode capacitor; which, in turn, results in a lower threshold device (which is easier to place into active mode). By contrast, a lower positive voltage applied to the control gate electrode 105 results in less positive charge being held by the floating gate electrode; which, in turn, results in a higher threshold device (which is harder to place in active mode). Furthermore, for a fixed applied $V_{DS}$ voltage, a lower threshold voltage essentially corresponds to more IDS current for a given voltage applied to the control gate electrode 105 than if the device had a higher threshold voltage.

These concepts permit a memory cell to be implemented where a first logic state (e.g., a 1) is written by applying a control gate voltage that sets the device at a first threshold level (e.g., a lower threshold level) and a second logic state (e.g., a 0) is written by applying a control gate voltage that sets the device at a second threshold level (e.g., a higher threshold level). If the device is always read with the same control gate voltage and $V_{DS}$ voltage, the device will exhibit different IDS currents depending on what logic state it is in (e.g., more $I_{DS}$ current if it has a lower threshold voltage, less $I_{DS}$ current if it has a higher threshold voltage).

FIG. 2 illustrates a naturally occurring hysteresis loop 200 that helps illustrate the behavior graphically. If the device was written as a "1" with a higher control gate voltage VCG_1 that established a lower threshold, when the device is later read with a control gate voltage VR, it will exhibit a higher IDS current (point A along leg 201) than if the device had been written as a "0" with a lower control gate voltage VCG_2 that established a higher threshold (IDS current point B along leg 202).

A problem with non volatile floating gate memory cell memories, however, is that the continued shrinking of them to improve their storage densities results in a thinning of dielectric layer 102. As dielectric layer 102 is made thinner and thinner, the capacitor formed with the floating gate electrode 103 and layer 102 begins to leak more and more current; which, in turn, corresponds to an inability of the device to hold the threshold level it is expected to sustain over long periods of time without electrical power being applied.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
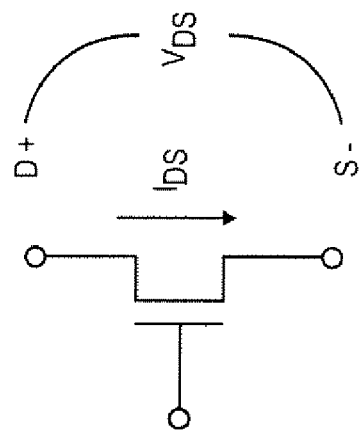
FIG. 1 (prior art) shows a floating gate FET.
Figure 1:
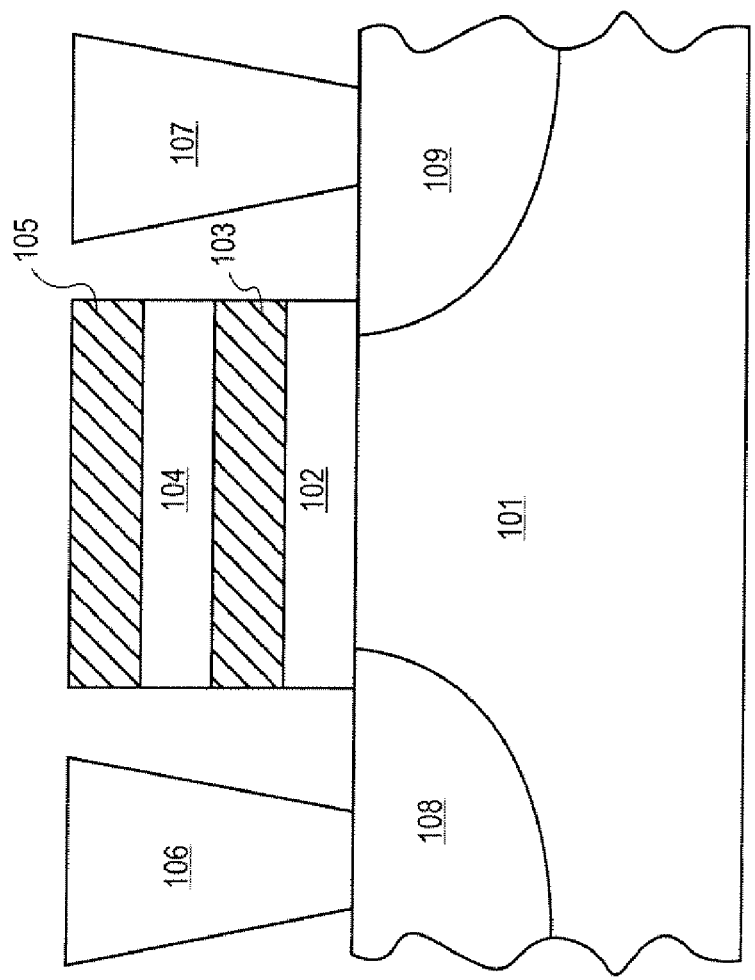
Figure 2:
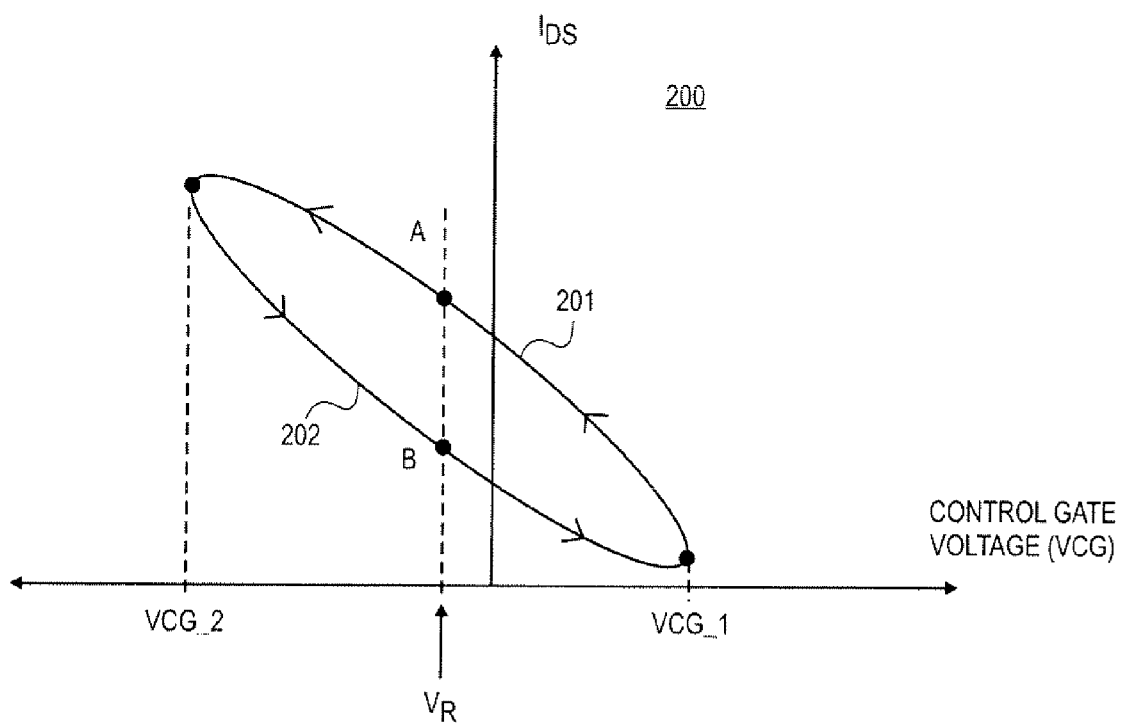
FIG. 2 (prior art) shows a hysterisis loop that illustrates behavior of the FET of FIG. 1.
Figure 3:
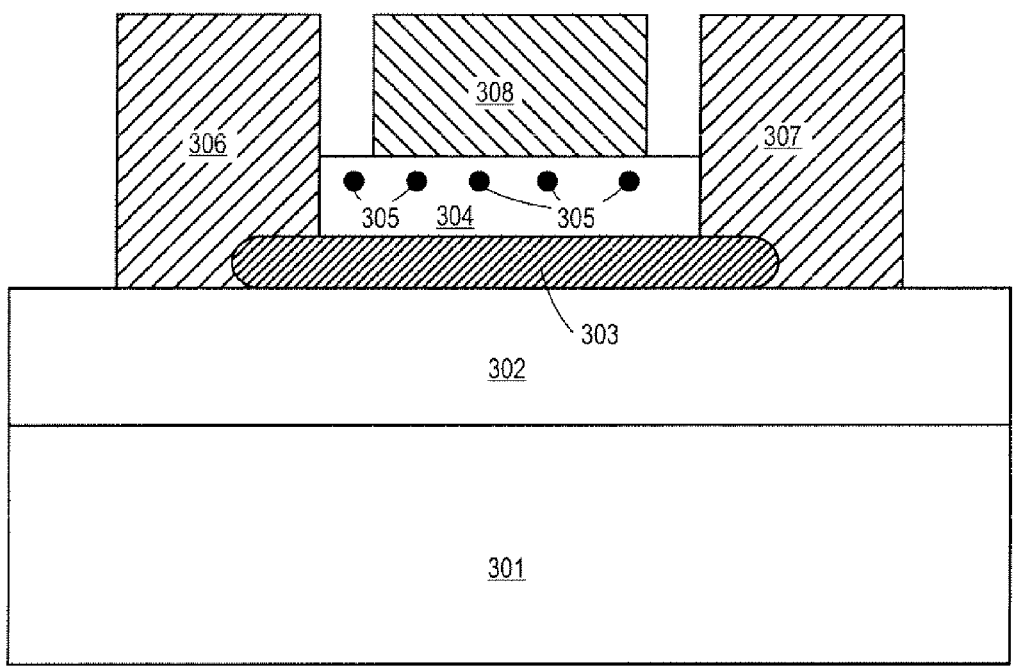
FIG. 3 shows a cross section of a floating gate FET device having a carbon nanotube channel and a plurality of isolated quantum dots as the device's floating gate structure.

FIG. 3 shows a new floating gate field effect device that employs the use of a carbon nanotube 303 for its channel and a plurality of quantum dots 305 as the floating gate electrode. According to the depiction of FIG. 3, the carbon nanotube 303 resides upon a buried oxide layer 302 that is formed on a silicon substrate 301. In one embodiment, the carbon nanotube 303 has a chirality and diameter that results in the carbon nanotube being deemed a semiconducting carbon nanotube. Use of a semiconducting carbon nanotube permits free charges sufficient for useful $I_{DS}$ currents to be induced in the carbon nanotube 303 by the device's corresponding gate structure. The carbon nanotube 303 is in electrical contact with a metal source electrode 306 and a metal drain gate electrode 307.

The gate structure of the device is made of individual quantum dots 305 that are embedded in a layer of dielectric 304. A layer of conductive material 308 (e.g., metal, degeneratively doped polycrystalline Silicon, etc.) resides above the dielectric layer 304. The layer of conductive material effectively behaves as the device's control gate and the quantum dots 305 effectively behave as the device's floating gate. A quantum dot is a body of material that is larger than an atom or molecule, but, is small enough that, like an atom, its electrons are contained in such a manner that it has quantized electron energy levels rather than continuous energy bands.

According to the principle of operation of the device, the carbon nanotube represents a channel that is small enough to have the device's threshold voltage be modulated for purposes of storing different logical states through the inducement of free carriers by very small amounts of charge held with capacitance formed by the quantum dots 305 and the dielectric layer 304.

Importantly, because the carbon nanotube is very small and therefore only needs small amounts of charge held by this capacitance to appreciably change the device's threshold voltage, the dielectric can be made "thick" so as to avoid present day scaling issues. For instance, the thickness of dielectric layer 304 may have a thickness within a range of 20-200 Å. The number of electrons vacated into control gate 308 from each quantum dot in order to impose a positive charge held by the capacitance may be small as 1, 10, 100 or 1000 or any range therein. The number of quantum dots per device may vary between 1, 10, 100, 1000 or any range therein as well.

Figure 4A:
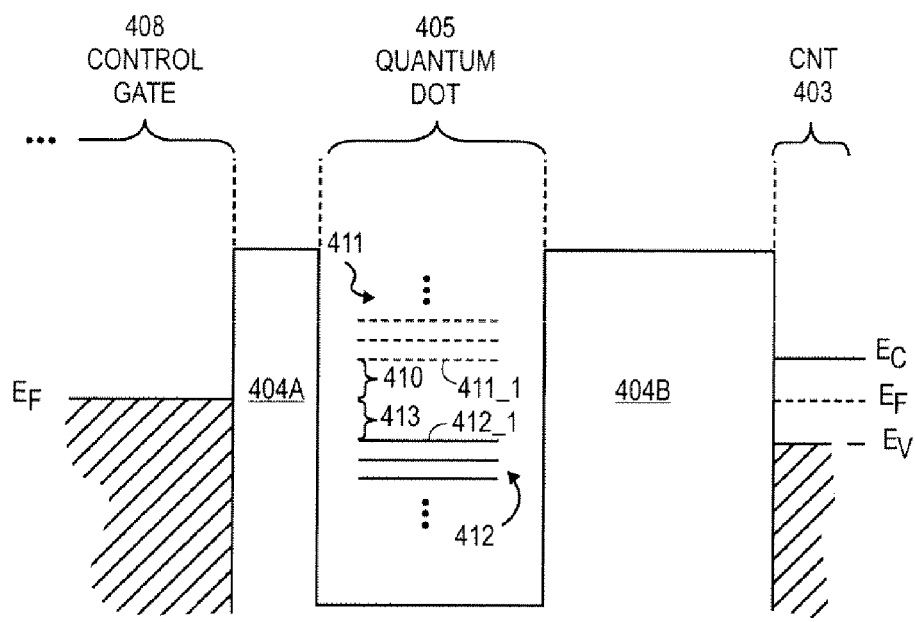
FIG. 4 illustrates the addition and removal of charge to a quantum dot within the device of FIG. 3.
Figure 4B:
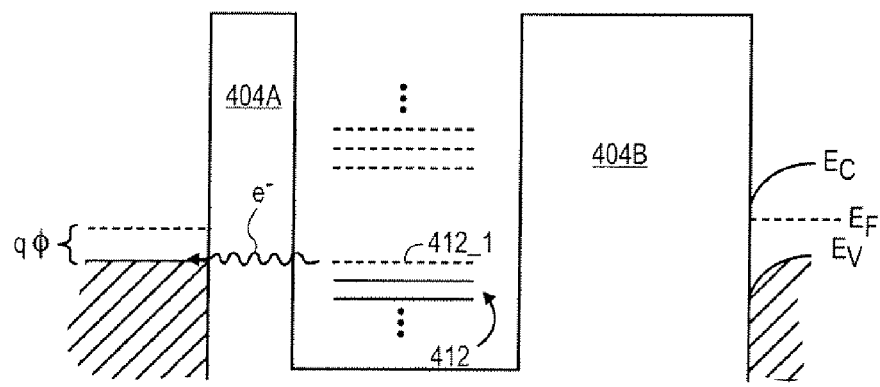

FIGS. 4a and 4b show energy band diagrams of a cross section of the device of FIG. 3. FIG. 4a depicts a "steady state" situation in which the control gate 408 is electrically neutral with respect to the source end of the carbon nanotube 403. According to the depiction of FIG. 4a, the energy bands of the quantum dot 405 contain empty discrete electron energy states (represented as dashed lines 411) above the Fermi level Ef and filled discrete electron energy states (represented as solid lines 412) beneath the Fermi level Ef.

Because of the energy difference 410 that exists between the lowest empty electron energy state 411_1 and the Fermi level Ef, electrons cannot tunnel from the control gate 408 into the quantum dot 405. Also, because of the energy difference 413 that exists between the highest filled electron energy state 412_1 and the Fermi level Ef, electrons cannot tunnel from the quantum dot 405 into the control gate 408. Further, the thickness of the dielectric 404B between the quantum dot 405 and the carbon nanotube 403 is sufficiently greater than the thickness of the dielectric 404A between the quantum dot and control gate 408 such that tunneling between the quantum dot 405 and the control gate 408 is a realistic consideration but tunneling between the quantum dot and the carbon nanotube 403 is not.

FIG. 4b shows an electron tunneling 414 into the control gate 408 from the highest filled state 412_1 in the quantum dot of FIG. 4a as a consequence of a positive potential $\phi$ being applied to the control gate 408. The tunneling of the electron corresponds to the electrically neutral quantum dot 405 of FIG. 4a gaining a positive electrical charge (i.e., analogizing further on the atom-like behavior of the quantum dot 405, the quantum dot becomes positively ionized). The gain of the electrical charge induces some band bending in the carbon nanotube 403 which reflects the generation of free carrier electrons into the carbon nanotube's conduction band Ec.

The quantum dot's 405 net positive charge is sustainable after externally applied voltages are removed because of the capacitance that exists between the quantum dot 405 and the control gate 408 (through dielectric region 404A), and, the capacitance that exists between the quantum dot 405 and the carbon nanotube 403 (through dielectric region 404B). That is, the depiction observed in FIG. 4b is sustained after the removal of externally applied voltages. In the particular case of FIG. 4b, the threshold of the device has been lowered by the band bending observed in the carbon nanotube 403.

The depiction of FIG. 4b corresponds to an n-channel approach where a positive charge is provided to the quantum well through tunneling of electrons into the control gate electrode 405. In an alternative p-channel approach, a negative voltage may be placed on the control gate electrode 408 to promote tunneling of an electron from the control gate electrode 408 into the quantum dot 405 so as to place a negative charge on the quantum dot 405. The quantum dot's negative charge will induce band bending of the carbon nanotube's valence band Ev toward the Fermi level which reflects the inducement of free hole carriers in the carbon nanotube resulting from the quantum dot's positive charge. This corresponds to a decrease in the threshold of the device because the carbon nanotube channel is closer to being electrically conductive.

FIG. 4b is basic in that it shows the tunneling of only a single electron into the quantum dot 405. Other implementations may choose to tunnel a plurality of electrons to/from a quantum dot 405. Generally, because tunneling into a first region from another, second region is promoted if the first region has the same or less energy than the second region, the more electrons to be tunneled to/from a quantum dot, the greater the applied voltage that needs to be applied to the control gate 408. For instance, referring to FIG. 4b, if two electrons were to be tunneled into the control gate 408, the potential $\phi$ would need to be increased so as to drop the energy level at or below the next filled energy state beneath energy state 412_1. Generally, the more quantum dots per device and the more electrons tunneled per quantum dot, the greater the effect on the threshold of the device for a given voltage applied to the control gate 408.

Quantum dots may be made of various materials (e.g., metals such as gold, or silver, semiconductors such as Si, Ge, III-V and II-VI compound semiconductors including InAs and CdSe) and may have various kinds of shapes (e.g., spherical, or facetted according to the crystalline structure of the specific material). Typically, irregardless of shape, quantum dots tend to have a longest dimension within a range of 10-50 Å.

A potential issue with the device of FIG. 3 is the fact that, because of the placement of the carbon nanotube on buried oxide 302, the device is essentially a non-planar device. As a consequence, attempts to construct devices with a single carbon nanotube are apt to behave differently. Specifically, device to device threshold variation may be unacceptably high because different numbers of free carriers are apt to be induced across carbon nanotubes for a same applied control gate voltage. In order to cure this problem multiple carbon nanotubes may be used per device. That is, the channel of the device may be implemented as a plurality of carbon nanotubes electrically coupled "in parallel" between the same source and drain electrodes.

Figure 5:
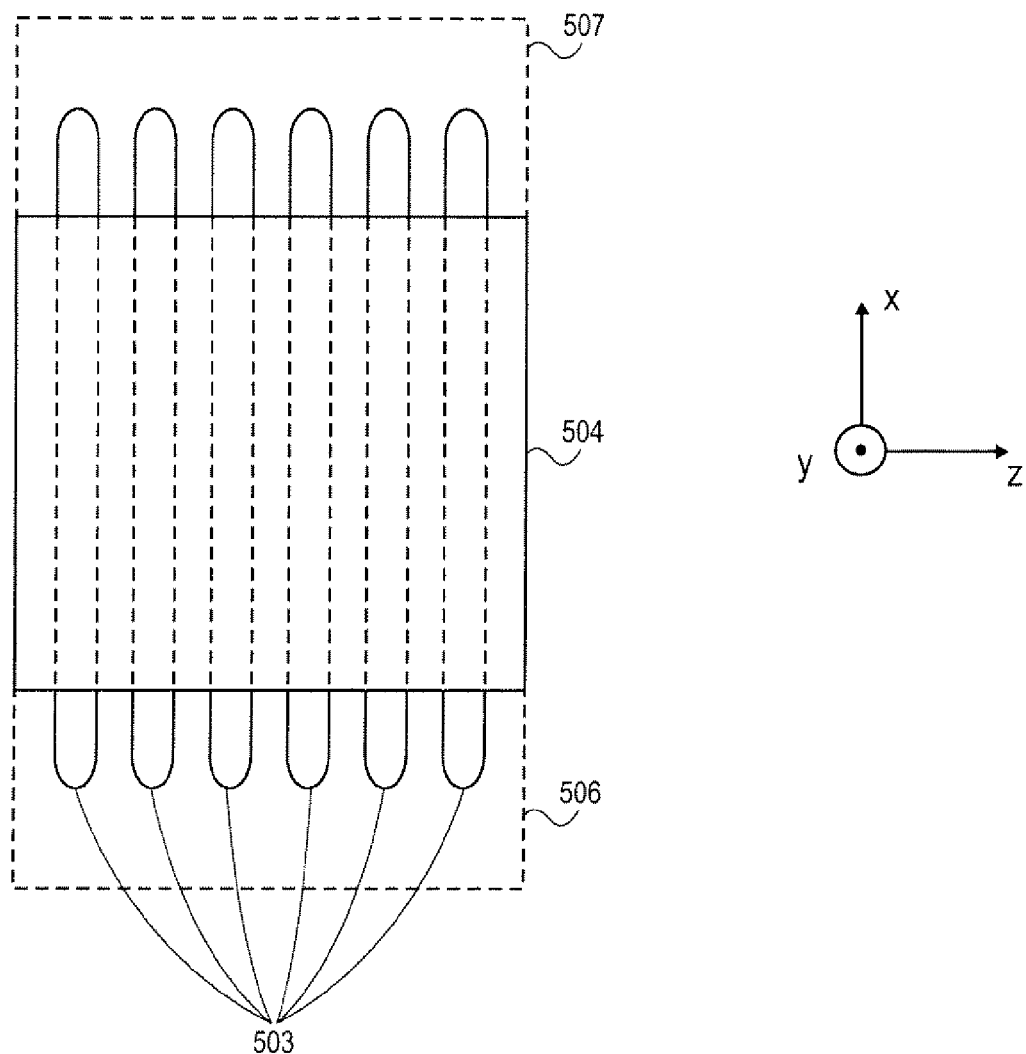
FIG. 5 illustrates a top down view of the device of FIG. 3.
Figure 6A:
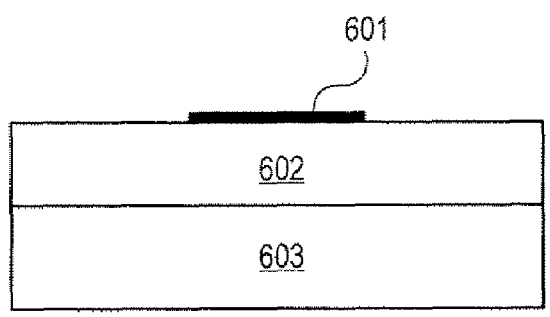
FIGS. 6a through 6d illustrates an embodiment of a methodology for fabricating the device of FIG. 3.
Figure 6B:
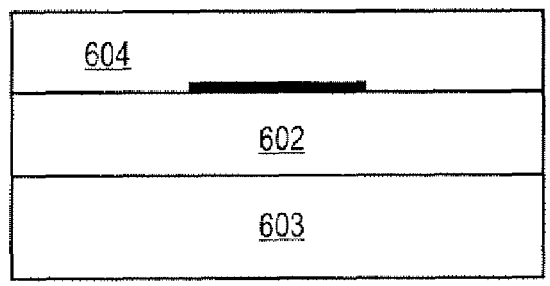
Figure 6C:
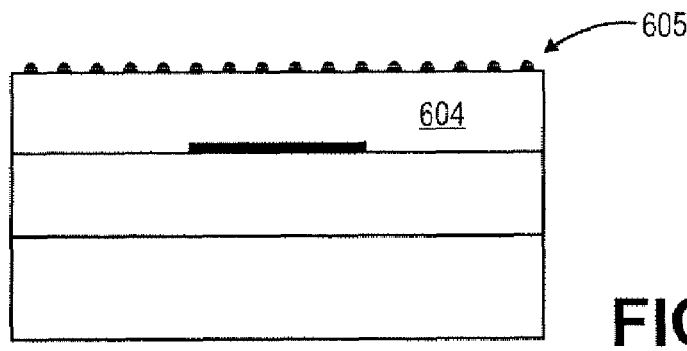
Figure 6D:
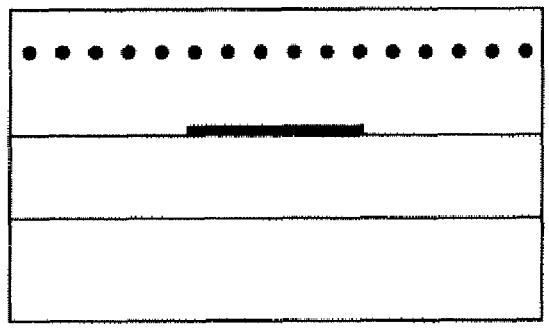

FIG. 5 shows a "top down" view of an embodiment of the device of FIG. 3 that incorporates the use of multiple carbon nanotubes per device. For simplicity, the control gate 308, the quantum dots and the buried oxide layer 302 are not shown. According to the depiction of FIG. 5, region 507 corresponds to drain node 307 and region 506 corresponds to source node 306. Region 504 corresponds to dielectric layer 504. As observed in FIG. 5, there exist multiple carbon nanotubes 503 that run between the source and drain nodes so as to have multiple carbon nanotubes per device. As a consequence, the threshold of the device will essentially track with the average number of induced carriers across the multiple nanotubes. Because the average number of induced carriers per device for a given control gate voltage is apt to be very similar across devices, the threshold device variation problem should effectively disappear.

FIGS. 6a through 6d depict an exemplary approach for fabricating the device shown above in FIG. 3. According to the depiction of FIG. 6a, multiple carbon nanotubes (only a single nanotube 601 is observable in FIG. 6a) are placed or grown using chemical vapor deposition on a buried oxide region which has been formed on a Si substrate 603. While this concept will work with a randomized nanotube position, number and orientation in each device, it is preferable that these quantities are more rigorously controlled. Use of Al2O3/Fe catalyst patterning and definition can determine the nanotube origin and number, while a number of in-situ growth techniques such as electrical field or gas flow directionality can aid in alignment. In addition a number of chemical lock-and-key methods can be used to deposit nanotubes in predefined location such as the Langmuir-Blodgett technique.

A layer of dielectric 604 is then formed over the carbon nanotubes. One or more quantum dots 605 are then placed on the layer of dielectric 604, either in random or highly ordered structure. The order structures can be obtained using self-assembly techniques that promote tight and dense packing of quantum dots on a lattice. A second layer of dielectric is then formed over the quantum dots to essentially "seal" the quantum dots within dielectric.

The device is completed by fabricating source, drain and gate electrodes. These can be done in a conventional subtractive, self-aligned way used in silicon manufacturing, (which would provide a self-aligned solution). A pertinent part of this methodology is the etch of the gate and dielectric as well as the spacers so as to not destroy any nanotubes or quantum dots. Alternatively, processes developed in the compound semiconductor industry arena which rely on non-self aligned source/drain and metallization/lift-off techniques can be used as they will be gentler on the nanotubes.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A transistor, comprising:
   a source electrode;
   a drain electrode;
   at least one semiconducting carbon nanotube electrically coupled between said source and drain electrodes;
   a gate electrode; and,
   dielectric material containing one or more quantum dots between said carbon nanotube and said gate electrode, wherein said one or more quantum dots are closer to said gate electrode than to said at least one carbon nanotube.

2. The transistor of claim 1 wherein at least one of said quantum dots are made of a material selected from the group consisting of:
   a metal;
   a semiconductor.

3. The transistor of claim 1 wherein each of said quantum dots have a largest dimension within a range of 10-50 Å.

4. The transistor of claim 1 wherein said gate electrode is comprised of polysilicon.

5. The transistor of claim 1 wherein said source and drain electrodes are comprised of metal.

6. The transistor of claim 1 wherein said dielectric layer has a thickness within a range of 20-200 Å.

7. A non volatile memory device comprising a storage cell having a transistor, comprising:
   a source electrode;
   a drain electrode;
   at least one semiconducting carbon nanotube electrically coupled between said source and drain electrodes;
   a gate electrode; and,
   dielectric material containing one or more quantum dots between said carbon nanotube and said gate electrode, wherein said one or more quantum dots are closer to said gate electrode than to said at least one carbon nanotube.

8. The non volatile memory device of claim 7 wherein at least one of said quantum dots are made of a material selected from the group consisting of:
   a metal;
   a semiconductor.

9. The non volatile memory device of claim 7 wherein each of said quantum dots have a largest dimension within a range of 10-50 Å.

10. The non volatile memory device of claim 7 wherein said gate electrode is comprised of polysilicon.

11. The non volatile memory device of claim 7 wherein said source and drain electrodes are comprised of metal.

12. The non volatile memory device of claim 7 wherein said quantum dots have a largest dimension within a range of 10-50 Å and are made of a material selected from the group consisting of:
   a metal;
   a semiconductor.

* * * * *